(12) United States Patent
Yamamoto et al.

(10) Patent No.: US 9,423,299 B2
(45) Date of Patent: Aug. 23, 2016

(54) EXPOSURE APPARATUS, EXPOSURE METHOD, AND DEVICE MANUFACTURING METHOD

(71) Applicant: CANON KABUSHIKI KAISHA, Tokyo (JP)

(72) Inventors: Kazuki Yamamoto, Shimotsuke (JP); Tadahiro Asaishi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 116 days.

(21) Appl. No.: 14/529,236

(22) Filed: Oct. 31, 2014

(65) Prior Publication Data
US 2015/0124232 A1    May 7, 2015

(30) Foreign Application Priority Data

Nov. 5, 2013    (JP) .................. 2013-228979

(51) Int. Cl.

| G01B 11/00 | (2006.01) |
|---|---|
| G03B 27/32 | (2006.01) |
| G03B 27/54 | (2006.01) |
| G03B 27/74 | (2006.01) |
| H01S 3/13 | (2006.01) |
| G01J 1/42 | (2006.01) |
| G03F 7/20 | (2006.01) |
| G03F 9/00 | (2006.01) |
| G01J 1/32 | (2006.01) |
| H01S 5/0683 | (2006.01) |

(52) U.S. Cl.
CPC .................. *G01J 1/429* (2013.01); *G01J 1/32* (2013.01); *G03F 7/70041* (2013.01); *G03F 7/70516* (2013.01); *G03F 7/70558* (2013.01); *G03F 9/7003* (2013.01); *G03F 9/7092* (2013.01); *H01S 5/0683* (2013.01)

(58) Field of Classification Search
CPC .......... G01J 1/32; G01J 1/429; G01J 1/4238; G01J 1/4252; G03F 7/70025; G03F 7/70041; G03F 7/70516; G03F 7/70558; G03F 9/70; G03F 9/7003; G03F 9/7092; H01S 5/0683
USPC ................. 355/67, 68, 71, 77; 356/399–401, 356/614–616, 622; 372/25, 29.01–29.015, 372/29.021
See application file for complete search history.

(56) References Cited

U.S. PATENT DOCUMENTS

| 5,250,797 A | 10/1993 | Sano et al. | |
|---|---|---|---|
| 2001/0010579 A1* | 8/2001 | Nishi | ...................... G03B 27/00 355/67 |

FOREIGN PATENT DOCUMENTS

| JP | 2785157 B2 | 8/1998 |
|---|---|---|
| JP | 3125307 B2 | 1/2001 |
| JP | 3259222 B2 | 2/2002 |

*Primary Examiner* — Colin Kreutzer
(74) *Attorney, Agent, or Firm* — Rossi, Kimms & McDowell LLP

(57) ABSTRACT

An exposure apparatus is provided with a light source for emitting pulse light and exposes a substrate via to the pulse light an original. Further, the exposure apparatus comprises a detection unit for detecting the light quantity of the pulse light and a controller for controlling the light source and the detection unit. Here, the controller is configured to execute a first calibration process for obtaining a relation between a control input to the light source and a light quantity of a pulse light from the light source, based on light quantities of a plurality of pulse lights detected by the detector by causing the light source to emit the plurality of the pulse lights with a plurality of the control input, in parallel with execution of a second calibration process which is different from the first calibration process and executed using the plurality of pulse lights.

9 Claims, 10 Drawing Sheets

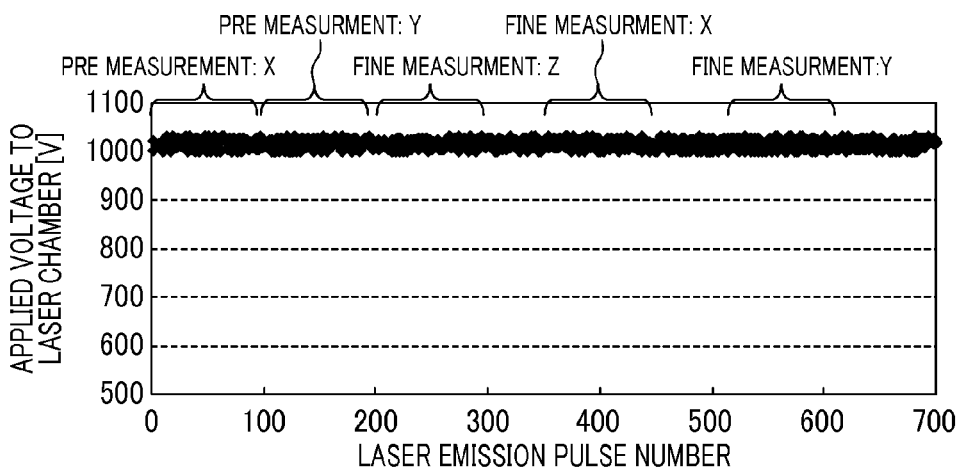
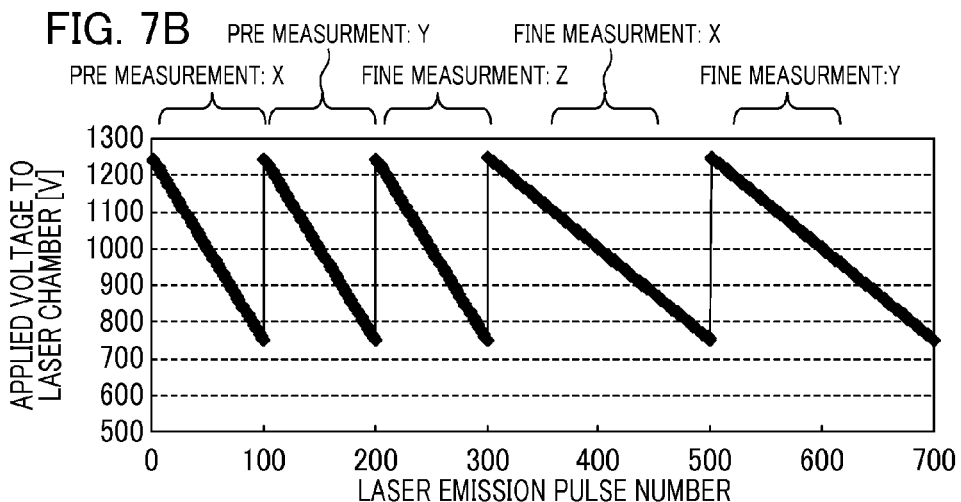
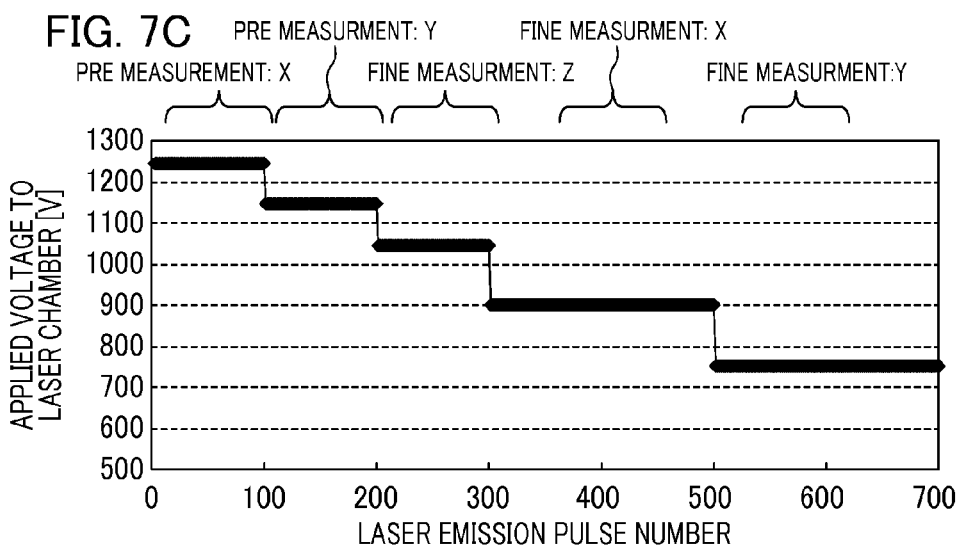

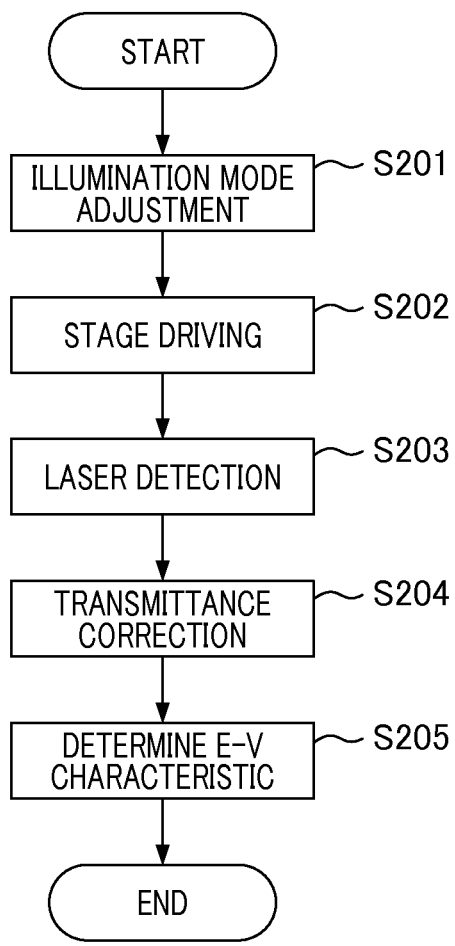

EXPOSURE APPARATUS, EXPOSURE METHOD, AND DEVICE MANUFACTURING METHOD

BACKGROUND OF THE INVENTION

1. Field of the Invention

The present invention relates to an exposure apparatus, an exposure method, and a device manufacturing method.

2. Description of the Related Art

An exposure apparatus exposes a substrate (a wafer formed with a resist layer on the surface thereof, or the like) via a pattern of an original (a reticle or the like), in a lithography step included in a manufacturing step of a semiconductor device, a liquid crystal display device or the like. Among this apparatus, there is a step-and-scan type exposure apparatus projecting an image of the pattern of the original to each shot area (a pattern transfer area) on the substrate by scanning the original and the substrate in synchronization, in the manufacturing step of the semiconductor device. In the scanning type exposure apparatus, it is necessary to set an (accumulated) exposure amount (dose) to each point in the exposure area within an allowable range based on a predetermined exposure amount, and to minimize uneven illuminance, in a similar manner to a step-and-repeat type one shot exposure apparatus. Then, for example, the exposure apparatus using an excimer laser as an exposure light adjusts an exposure amount by adjusting an applied voltage to a laser chamber in a light source and controlling pulse energy of the laser.

FIG. 10 is a graph illustrating the pulse energy of the laser (light emission output) versus the applied voltage to the laser chamber, as a characteristic of the excimer laser. Hereinafter, the characteristic is referred to as "E-V characteristic", or only referred to as "E-V". The E-V characteristic changes with a time depending on the density and temperature of the gas filled into the laser chamber or a discharge electrode condition. Accordingly, it is necessary to appropriately correct the E-V characteristic when the pulse energy is controlled based on the E-V characteristic. Japanese Patent No. 2785157 and Japanese Patent No. 3259222 respectively disclose an exposure apparatus for determining the E-V characteristic from the laser pulse energy emitted during exposure and the applied voltage at that time, and for determining the applied voltage based on a newest E-V characteristic. Moreover, Japanese Patent No. 3125307 discloses an exposure apparatus that performs E-V measurement for each of a number of a predetermined unit pulse or unit time, or each time of gas exchange in the laser chamber and corrects a control parameter.

The laser light of the excimer laser includes energy variation about plus or minus 10 percent per pulse. Thus, it is desirable to irradiate a plurality of pulses to average the variation, in order to precisely measure the E-V characteristic of the excimer laser. The number of irradiation pulses required for the measurement of the E-V characteristic depends on the required measuring precision, and in general, this is equal to or more than hundreds of pulses. Further, in order to precisely measure the E-V characteristic, it is desirable to determine the E-V characteristic from the result produced by the laser pulse energy and the applied voltage to the laser chamber being measured at a plurality of times by using different set values, where light is emitted in a wide energy range.

Here, in the exposure apparatus disclosed in Japanese Patent No. 3259222, the applied voltage during exposure is determined by an exposure process, and in general, the exposure amount is controlled so as to be uniform in the shot area. Accordingly, the applied voltage is distributed over a narrow range, and it is difficult in fact to precisely measure the E-V characteristic over a wide range. Moreover, in a case where the E-V characteristic largely shifts due to events such as gas exchange of the laser, there is a possibility that the exposure cannot be correctly controlled between hundreds of the pulses until the E-V measurement and the correction process thereof is completed. In contrast, in the exposure apparatus disclosed in Japanese Patent No. 2785157, the first situation in the Japanese Patent No. 3259222 does not occur, since the applied voltage to the laser chamber during the exposure is optionally changed in sequence for the E-V measurement. However, in the method in Japanese Patent No. 2785157, the application is limited to the exposure apparatus performing the exposure, with the original and the substrate stopped. In the exposure apparatus disclosed in Japanese Patent No. 3125307, the situation in the above Japanese Patent No. 3259222 does not occur since the E-V measurement is performed each time of the predetermined event. However, a decrease of throughput may be caused since the E-V measurement is performed separately from the exposure process to the substrate.

SUMMARY OF THE INVENTION

The present invention provides, for example, an exposure apparatus advantageous in terms of dose control precision and throughput.

The present invention is an exposure apparatus that includes a light source for emitting pulse light and exposes a substrate to the pulse light via an original, the apparatus including a detector configured to detect a light quantity of the pulse light; and a controller configured to control the light source and the detector, wherein the controller is configured to execute a first calibration process for obtaining a relation between a control input to the light source and a light quantity of a pulse light from the light source, based on light quantities of a plurality of pulse lights detected by the detector by causing the light source to emit the plurality of the pulse lights with a plurality of the control input, in parallel with execution of a second calibration process which is different from the first calibration process and executed using the plurality of pulse lights.

Further features of the present invention will become apparent from the following description of exemplary embodiments with reference to the attached drawings.

BRIEF DESCRIPTION OF THE DRAWINGS

FIGS. 7A to 7C are graphs illustrating applied voltages to the laser chamber at each measurement.

FIG. 9 is a flowchart illustrating an operation sequence of transmittance measurement.

DESCRIPTION OF THE EMBODIMENTS

Hereinafter, preferred embodiments of the present invention will be described with reference to the drawings.

First Embodiment

Figure 1:
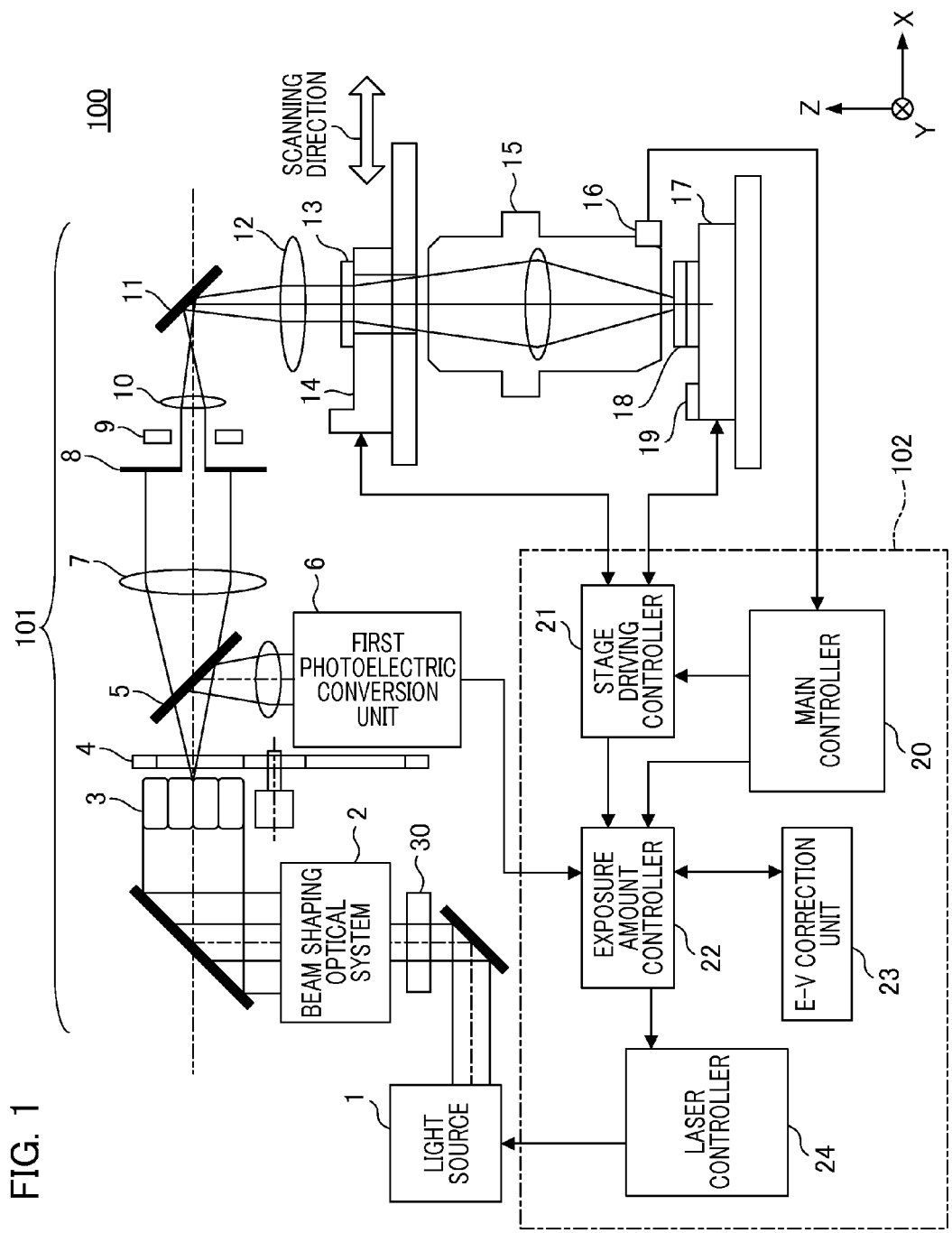
FIG. 1 illustrates a configuration of an exposure apparatus according to one embodiment of the present invention.

Firstly, a description will be given of an exposure apparatus according to first embodiment of the present invention. FIG. 1 is a schematic diagram illustrating a configuration of an exposure apparatus 100 according to the present embodiment. The exposure apparatus 100 is used in, for example, a manufacturing step of a semiconductor device, which serves as a lithography apparatus. The exposure apparatus 100 is a scanning type projection exposure apparatus which exposes (transfers) a pattern formed on a reticle 13 onto a wafer 18 (onto a substrate) by a step-and-scan method, in particular, in the present embodiment. The exposure apparatus 100 comprises an illumination system 101, a reticle stage 14, a projection optical system 15, a wafer stage 17, a focus detection system 16, and a controller 102. In FIG. 1, a Z-axis is aligned parallel to an optical axis (a vertical direction in the present embodiment) of the projection optical system 15, an X-axis is aligned in a scanning direction of the reticle 13 and the wafer 18 upon exposure in a plane perpendicular to the Z-axis, and a Y-axis is aligned in a non-scanning direction orthogonal to the X-axis.

The illumination system 101 adjusts light (pulse light) from a light source (a laser light source) 1 and illuminates the reticle 13, and includes the following elements. It is presumed that the light source 1 in the present embodiment is an excimer laser light source. The description starts from the light source 1 side. An ND filter unit 30 is capable of exchanging and arranging various kinds of ND filters on an optical pass, and adjusts the light quantity of the light emitted from the light source 1. A beam shaping optical system 2 shapes the light passed through the ND filter into the predetermined form. An optical integrator 3 is provided with a plurality of small lenses, receiving the light that is shaped in the beam shaping optical system 2 on a light incident plane, and forms a large number of secondary light sources in the vicinity of a light emission plane. A aperture diaphragm turret 4 limits the size of the surfaces of the secondary light sources by using a predetermined diaphragm. A plurality of diaphragms to which a number (an illumination mode number) is given, such as an aperture having various circular opening sizes for setting a coherence factor σ value to various types, a ring-shaped aperture for zonal illumination, or a quadrupole aperture, is embedded in the aperture diaphragm turret 4. Then, the aperture diaphragm turret 4 selects the necessary diaphragm when changing the form of the incident light source of the illumination light. A first photoelectric conversion unit (a first detection unit) 6 partially detects the light reflected on a half mirror 5 as the light quantity per pulse, and outputs to an exposure amount controller 22 described below. A condenser lens 7 illuminates a masking blade 9 with a light flux from the secondary light sources in the vicinity of the light emission surface of the optical integrator 3. A variable slit 8 is located in the vicinity of the masking blade 9 and forms a profile of slit light illuminating the masking blade 9 to be a rectangular or a round form. The slit light forms an image on the reticle 13 that is a conjugate plane of the masking blade 9 thorough a condenser lens 10, a mirror 11, and a condenser lens 12 in a state in which illuminance and angle of incidence are made uniform. Here, the opening area on the masking blade 9 is analogous to the desired pattern exposure area of the reticle 13 at optical magnification. Then, during exposure, the masking blade 9 shields the outside of the exposure area of the reticle 13 and the reticle stage 14 scans in synchronization at optical magnification.

Figure 2:
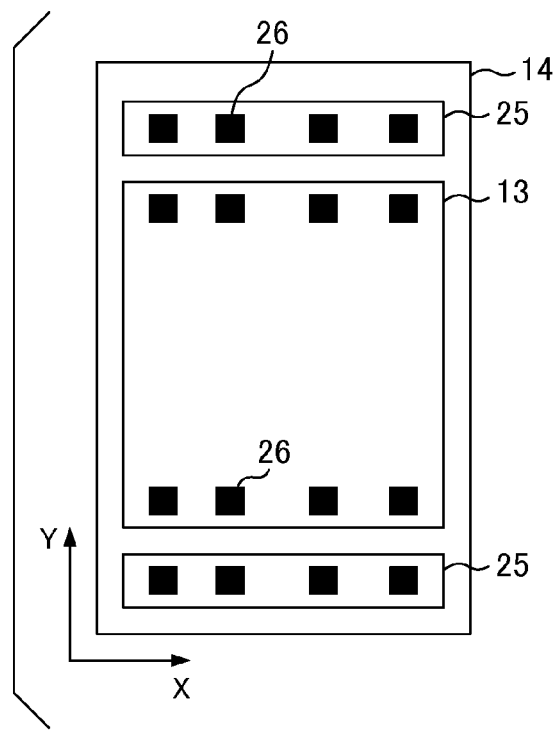
FIG. 2 illustrates a reticle stage in a state of holding a reticle.

The reticle 13 is an original made of, for example, silica glass, formed with a pattern (for example, a circuit pattern) to be transferred onto the wafer 18. The reticle stage (original holder) 14 holds the reticle 13 and is movable in each of the X or Y-axis directions. The reticle stage 14 has reticle side adjustment marks 26 used for alignment of the reticle stage 14 and the wafer stage 17 (hereinafter referred to as "stage alignment"). FIG. 2 is a plan view illustrating the reticle stage 14 in a state of holding the reticle 13. The reticle stage 14 comprises reticle reference plates 25 located at, for example, both sides of the reticle 13 which face each other on the basis of the reticle 13 in a XY plane as shown in FIG. 2. A plurality of optical marks used for adjustment and correction of the exposure apparatus 100 are arranged in the reticle reference plates 25, and some of them are reticle side adjustment marks (original side marks) 26. The reticle side adjustment marks 26 are not necessarily arranged in the reticle reference plates 25, and it may be possible, for example, that they are arranged (formed) in the reticle 13 as also shown in FIG. 2.

The projection optical system 15 projects the slit light passed through the reticle 13 on the wafer 18 at a predetermined magnification (for example, ½ to ⅕). Then, the slit light that is incident in the projection optical system 15 forms an image on an exposure field angle area in a pattern surface and an optical conjugate plane of the reticle 13 on the wafer 18, as slit-shaped exposure light.

Figure 3:
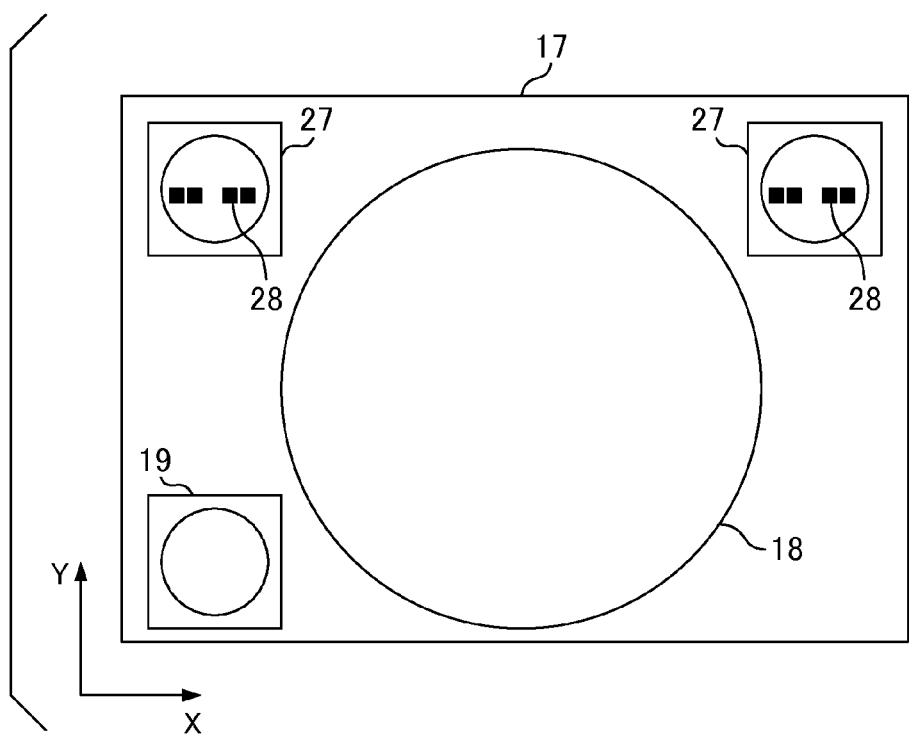
FIG. 3 illustrates a wafer stage in a state of holding a wafer.

The wafer 18 is a substrate made, for example, of single crystal silicon, where a resist (photosensitizer) is applied to the surface thereof. The wafer stage (substrate holder) 17 holds the wafer 18 and is movable in each of the axis directions of the X, Y and Z-axis (ωx, ωy, and ωz that are respectively each rotating direction may be included). FIG. 3 is a plan view illustrating the wafer stage 17 in a state of holding the wafer 18. The wafer stage 17 comprises a second photoelectric conversion unit 19 and a stage position measurement unit 27 around a chuck (not illustrated) for holding the wafer 18 by vacuum suction. The second photoelectric conversion unit (second detection unit) 19 measures the light quantity of the exposure light on the exposure field angle before an exposure is performed. The second photoelectric conversion unit 19 is capable of simultaneously measuring an accumulated exposure amount (accumulated dose) at each point in the exposure area and a deviation from a predetermined exposure amount, by measuring the exposure light while scanning according to the movement of the wafer stage 17. It is noted that the second photoelectric conversion unit 19 is used at performing a second embodiment described below, in particular. The stage position measurement unit 27 further includes a photoelectric conversion element (LIPS sensor) and wafer side adjustment marks (substrate side marks) 28. The wafer side adjustment marks 28 are the same in shape as the reticle side adjustment marks 26 in the reticle stage 14.

Figure 4:
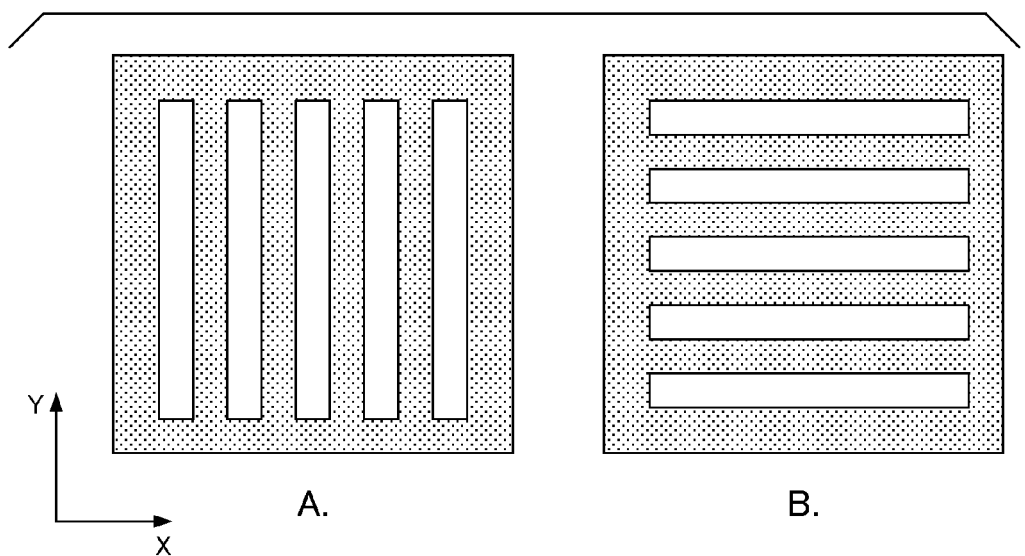
FIG. 4A and FIG. 4B illustrate shapes of marks for adjusting a stage.

FIGS. 4A and 4B are plan views illustrating shapes of the marks for stage adjustment (the reticle side adjustment marks 26 and the wafer side adjustment marks 28). The stage alignment is performed on a plurality of components, such as an X-component, a Y-component, a Z-component, a tilt component, or a projection magnification component. Here, the marks used for the measurement of each component are not necessarily the same. For example, for the stage position measurement in the X-axis direction, it is preferable to use the mark that is high in sensitivity to the X-axis direction and has a plurality of slits extending in the Y-axis direction as shown in FIG. 4A. In contrast, for the stage position measurement in the Y-axis direction, it is preferable to use the mark that is high in sensitivity to the Y-axis direction and has a plurality of slits extending in the X-axis direction as shown in FIG. 4B. Further, each component may be determined by one time measurement of each mark shown in FIGS. 4A and 4B, or may be determined by combination of equal to more than two measurements. The stage alignment is accompanied by suitably moving the wafer stage 17 while illuminating the light from the light source 1 to the reticle side adjustment marks 26 and by detecting the position in accordance with the wafer side adjustment marks 28. The stage alignment is performed when expansion and contraction of structure, such as the reticle 13, the wafer 18, each stage 14 and 18 or the like caused by temperature changes in the exposure apparatus 100 is corrected, or when each laser interferometer (not illustrated) for measuring the positions of each stage 14 and 18 is initialized. More strictly, the stage alignment may be periodically performed, for example, each time one wafer 18 is processed.

The focus detection system 16 detects the height and the tilt of the exposure surface on the wafer 18 held by the wafer stage 17. During the scan exposure, a controller 102 described below scans the reticle stage 14 and the wafer stage 17 in synchronization while controlling the drive of the wafer stage 17 so that the exposure surface of the wafer 18 coincides with the exposure area surface.

The controller 102 executes an operation control, an arithmetic process and the like of each element of the exposure apparatus 100. The controller 102 is configured by, for example, a computer, and connected to each element of the exposure apparatus 100 through a line and enables executing each control according to a program and the like. More specifically, the controller 102 can include each control unit which takes on following individual roles. A main controller 20 integrates processes according to each individual controller described in the following. The illumination mode or exposure amount when the wafer 18 is exposed is set to the main controller 20 from a user interface (not illustrated). A stage driving controller 21 executes the control of simultaneous scanning of the reticle stage 14 and the wafer stage 17 during the scan exposure, including the position control of the exposure surface. The exposure amount controller 22 sends electric signals, which are photoelectrically converted at the first photoelectric conversion unit 6 and the stage position measurement unit 27 or the second photoelectric conversion unit 19 respectively, to the main controller 20, and sends a pulse light quantity signal to a laser controller 24. The main controller 20 determines the correlation between the light quantity measured at the first photoelectric conversion unit 6, and the light quantity measured at the stage position measurement unit 27 or the second photoelectric conversion unit 19. The exposure amount controller 22 converts the output value of the first photoelectric conversion unit 6 into the light quantity on the wafer 18 using the correlation, and then the converted value stands for a monitor light quantity for controlling the exposure amount. The monitor light quantity is identifiable as the light quantity on the wafer 18, and logical value (unit: bit) which is converted at the exposure amount controller 22, from each output from the first photoelectric conversion unit 6 and the stage position measurement unit 27 or the second photoelectric conversion unit 19 shows light quantity itself. An E-V correction unit 23 receives a plurality of output values of the first photoelectric conversion unit 6 when the laser is emitted and a plurality of applied voltages commanded to the light source 1 at that time, from the exposure amount controller 22, and determines E-V characteristic using, for example, a least-squares method, and sends the result to the exposure amount controller 22. The laser controller (laser output and oscillating frequency determination unit) 24 generates the respective control inputs (trigger signal and applied voltage signal) based on the pulse light quantity signal from the exposure amount controller 22, sends them to the light source 1, and controls the oscillating frequency and the pulse energy of the light source 1. It is noted that the controller 102 may be integrated with the rest of the exposure apparatus 100 (in a shared housing) or may also be provided separately from the rest of the exposure apparatus 100 (in separate housing).

During the scan exposure, the exposure apparatus 100 transfers the pattern on the resist layer on the wafer 18 by irradiating the slit light to the wafer 18, while scanning the reticle stage 14 and the wafer stage 17 in synchronization. Here, the exposure apparatus 100 adjusts the applied voltage to the laser chamber in the light source 1 and controls the pulse energy of the laser, and adjusts the exposure amount in order to set the accumulated exposure amount at each point in the exposure area on the wafer 18 in the predetermined exposure amount and minimize uneven illuminance. Then, the exposure apparatus 100 determines the E-V characteristic from the pulse energy of the laser and the applied voltage at that time. The exposure apparatus 100 stores a newest E-V characteristic in a storage unit (not illustrates) in the apparatus, and determines the most suitable applied voltage at that time by appropriately referring to the E-V characteristic, and uses it as a control parameter at subsequent laser control. In this result, the exposure apparatus 100 enables decreasing a low resolution of the pattern due to the exposure amount and enables improving the yield in the manufacturing step of the semiconductor device.

In the present embodiment in particular, the exposure apparatus 100 performs the process for determining the E-V characteristic as a first calibration process in parallel with a calibration process as a second calibration process. Hereinafter, the case that the calibration process is the stage alignment (the process for determining the reference position of the wafer stage 17) is presumed as an example, the flow will be described.

Figure 5:
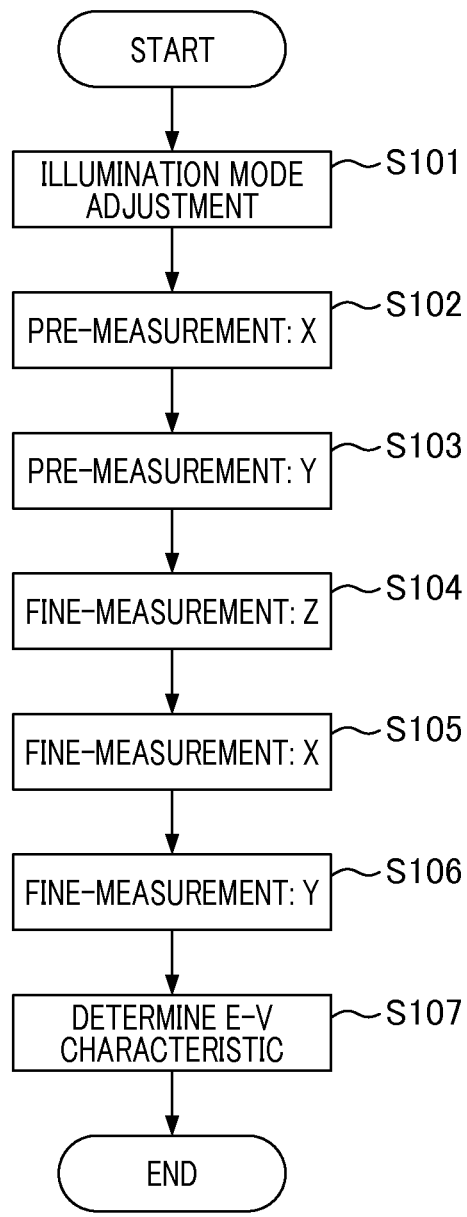
FIG. 5 is a flowchart illustrating an operation sequence of stage alignment.

FIG. 5 is a flowchart illustrating an operation sequence of the stage alignment in the present embodiment. Firstly, the controller 102 commands the illumination system 101 to drive the ND filter and each optical element for matching the illumination mode and the optical condition during exposure, as an adjustment of the illumination mode (step S101). Secondly, the controller 102 performs pre-measurement for bringing the measurement position of the stage position measurement unit 27 within the range of the following fine-measurement, while moving the wafer stage 17 in the X-axis direction (step S102). Thirdly, the controller 102 performs the pre-measurement for bringing the measurement position of the stage position measurement unit 27 within the range of the fine-measurement in the following process, while moving the wafer stage 17 in the Y-axis direction (step S103). It is noted that the reticle side adjustment marks 26 and the wafer side adjustment marks 28 are used at each pre-measurement, wherein the mark pitch used at each pre-measurement is larger than that used at the fine-measurement.

Here, in the pre-measurement in a conventional exposure apparatus, the light emitted from the light source 1 is controlled at a constant luminance in order to constantly hold the pulse light quantity in one measurement. Hereinafter, the measurement result in the case that the conventional exposure apparatus performs the pre-measurement will be described as a reference, in order to clarify the feature of the present embodiment.

Figure 11A:
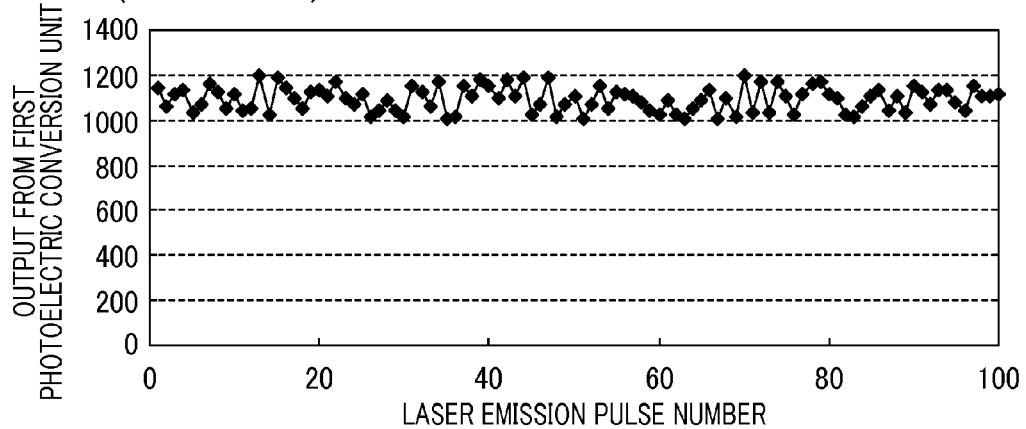
FIGS. 11A to 11C are graphs illustrating measurement results obtained by a pre-measurement in the conventional exposure apparatus.
Figure 11B:
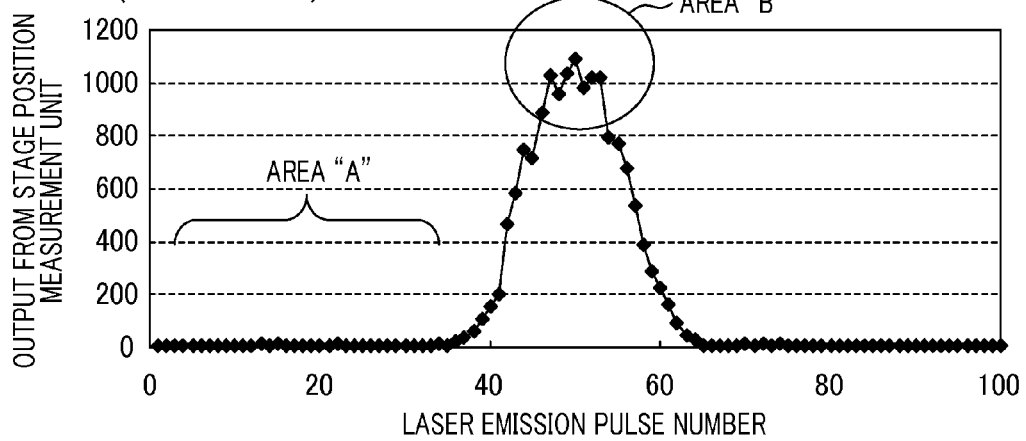
Figure 11C:
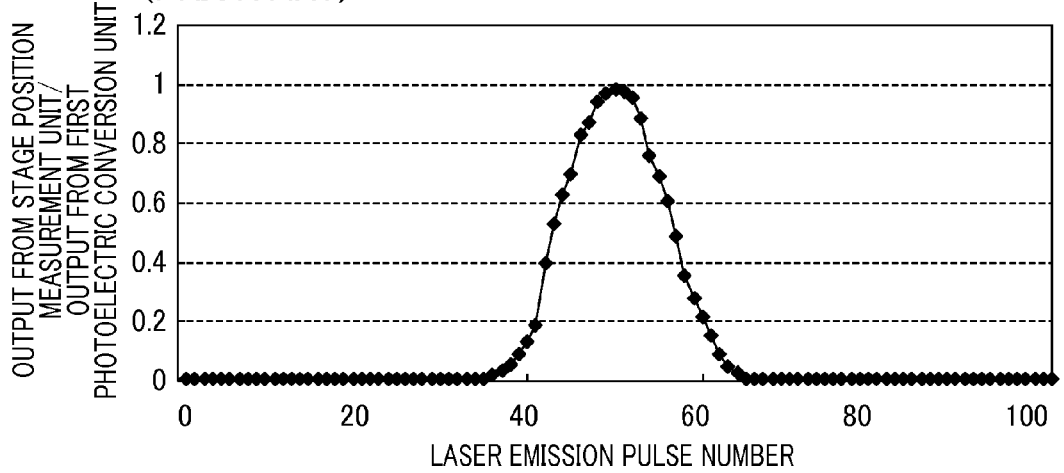

FIGS. 11A to 11C are graphs illustrating one example of the measurement result according to the pre-measurement in the conventional exposure apparatus. It is noted that same reference numeral is provided to each element of the conventional exposure apparatus corresponding to each element of the exposure apparatus 100 according to the present embodiment in order to simplify the description. FIG. 11A is a graph illustrating the output result of the first photoelectric conversion unit 6 upon pre-measurement to a laser emission pulse number. Since the first photoelectric conversion unit 6 is located close to the light source 1 compared to the reticle stage 14, the laser output itself from the light source 1 can be detected as shown in FIG. 11A. FIG. 11B is a graph illustrating the output result of the stage position measurement unit 27 corresponding to the laser emission pulse number shown in FIG. 11A. When the reticle side adjustment marks 26 and the wafer side adjustment marks 28 do not overlap, the output from the stage position measurement unit 27 is approximately zero, since light does not reach the photoelectric conversion element in the stage position measurement unit 27 (area "A" shown in FIG. 11B). When the wafer stage 17 scans, the reticle side adjustment marks 26 and the wafer side adjustment marks 28 overlap, and the output from the stage position measurement unit 27 becomes maximum at the timing at which the reticle side adjustment marks 26 and the wafer side adjustment marks 28 match (area "B" shown in FIG. 11B). The controller 102 records the stage position at the peak period of the output from the stage position measurement unit 27, and uses it for correcting the stage position. FIG. 11C is a graph illustrating the result that the output from the stage position measurement unit 27 is normalized by the output from the first photoelectric conversion unit 6. The excimer laser has energy variation about plus or minus 10 percent per pulse. Accordingly, when the peak position of the stage position measurement unit 27 is detected, the controller 102 normalizes the output from the stage position measurement unit 27 by using the output from the first photoelectric conversion unit 6, as shown in FIG. 11C, to suppress the influence of variation of the light source 1.

In contrast, in the pre-measurement in the exposure apparatus 100 of the present embodiment, the applied voltage to the light source 1 is changed per pulse number, and the laser emission is controlled by a profile shown in the following.

Figure 6A:
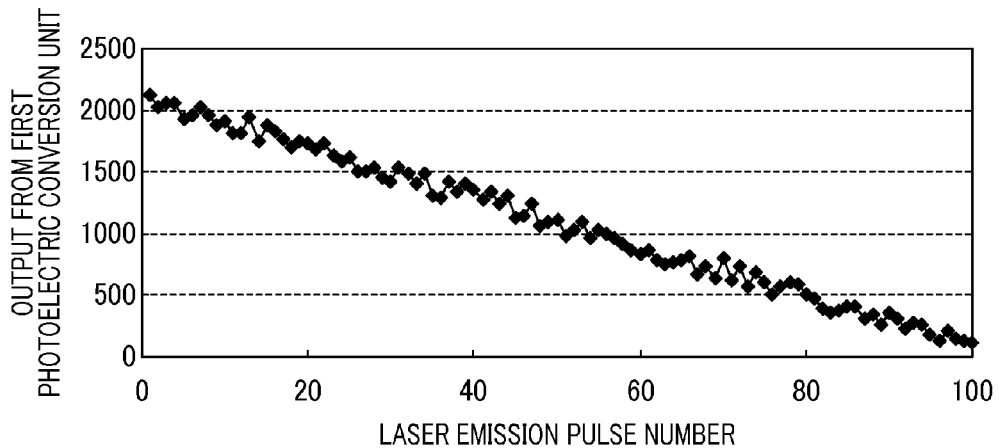
FIGS. 6A to 6C are graphs illustrating measurement results obtained by pre-measurement in the present embodiment.
Figure 6B:
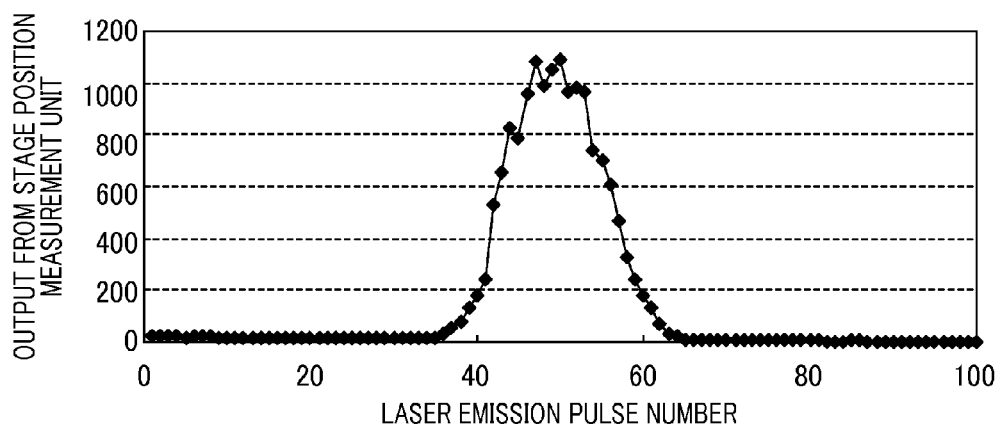
Figure 6C:
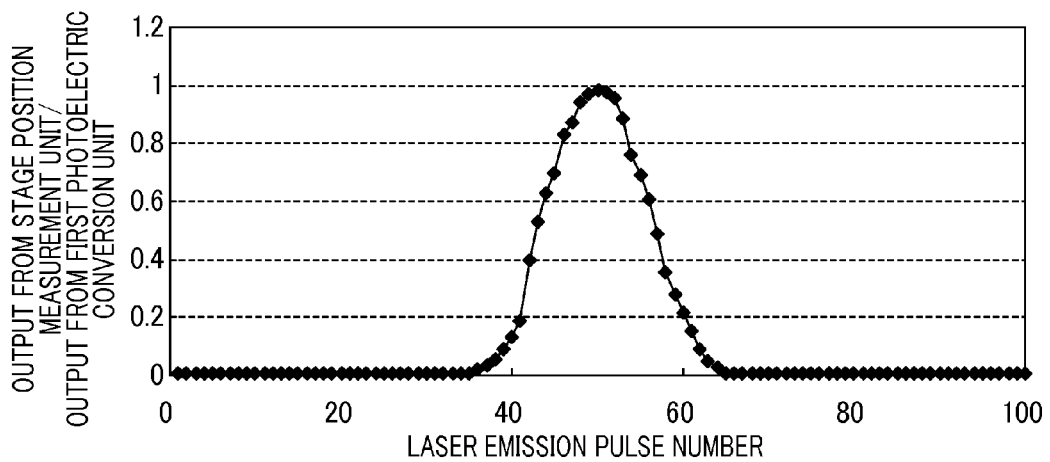

FIGS. 6A to 6C are graphs illustrating one example of the measurement result according to the pre-measurement in the exposure apparatus 100 of the present embodiment. Here, FIG. 6A corresponds to FIG. 11A showing the conventional case, and FIG. 6B and FIG. 6C respectively correspond to FIG. 11B and FIG. 11C. Particularly in the present embodiment, as shown in FIG. 6A, the laser controller 24 controls the applied voltage to the laser chamber in the light source 1 so as to decrease the output from the first photoelectric conversion unit 6 according to a linear function against the increase of the laser emission pulse number. Accordingly, as shown in FIG. 6B, the output from the stage position measurement unit 27 slightly changes compared to the output shown in FIG. 11B. However, the output from the stage position measurement unit 27 is normalized by the output from the first photoelectric conversion unit 6 as shown in FIG. 6C, so that it is possible to eliminate the influence on the measuring precision of the stage position even if the applied voltage is controlled as above. It may be possible that the laser controller 24 controls the applied voltage so that the output from the first photoelectric conversion unit 6 provides a profile which changes like a higher function or sin function, in addition to a linear function.

The detection of the peak position is performed not only at the pre-measurement but also at the fine-measurement. Since the energy variable range of the excimer laser is about plus or minus 15 percent of the rated illumination in general, it is desirable that the laser controller 24 controls the applied voltage to the light source 1 within the range from the upper limit to the lower limit in the energy variable range at each pre-measurement. Further, it may be possible to omit steps S102 and S103 if relative position of the reticle stage 14 and the wafer stage 17 is brought in the measurement range of the fine-measurement.

As shown in the flowchart of FIG. 5, the controller 102 performs the fine-measurement for observing the marks at the stage position measurement unit 27 while moving the wafer stage 17 in the Z-axis direction (step S104). Next, the controller 102 performs the fine-measurement for observing the marks at the stage position measurement unit 27 while moving the wafer stage 17 in the X-axis direction (step S105). Then, the controller 102 performs the fine-measurement for observing the marks at the stage position measurement unit 27 while moving the wafer stage 17 in the Y-axis direction (step S106). In each fine-measurement, the reticle side adjustment marks 26 and the wafer side adjustment marks 28, whose mark pitches are smaller than the marks used in the pre-measurement are used. Particularly in the fine-measurement of Z-axis in step S104, since the output from the stage position measurement unit 27 becomes maximum when the wafer stage 17 moves to a best focus, it is possible to specify the best focus position of the wafer stage 17. It is noted that in the stage alignment, a plurality of marks are further observed in addition to the X-element, the Y-element, or the Z-element, and the measurement of the tilt component and the projection magnification component may be performed.

FIGS. 7A to 7C are graphs illustrating the applied voltage to the laser chamber at each timing of the measurement from step S102 to step S106. Here, the laser is oscillated per 100 pulses in the pre-measurement in steps S102 and S103, and the laser is oscillated per 200 pulses in the fine-measurement from step S104 to step S106. FIG. 7A illustrates an example of the laser oscillation in the conventional exposure apparatus, as a reference, in which the applied voltage is set constant to some extent so that the laser output becomes constant. FIG. 7B illustrates a first example of the laser oscillation in the present embodiment, in which the applied voltage is reduced according to a linear function from the upper limit to the lower limit in each measurement. FIG. 7C illustrates a second example of the laser oscillation in the present embodiment, in which the applied voltage is changed at each measurement while controlling the laser with the constant applied voltage in each measurement.

Shown in the flowchart of FIG. 5, the controller 102 determines the E-V characteristic of the laser by using the measurement results from the step S102 to the step 106 (step S107). Here, the E-V characteristic is determined by using, for example, the least-squares method from the applied voltage to the laser chamber and the pulse energy that is output at the moment.

Figure 8A:
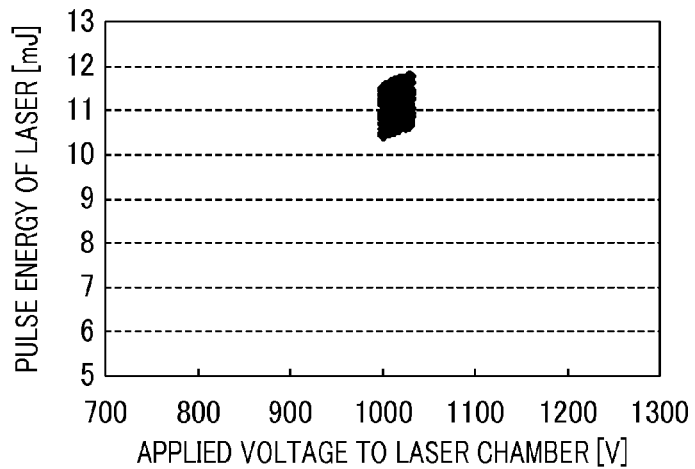
FIGS. 8A to 8C are graphs illustrating E-V characteristics.
Figure 8B:
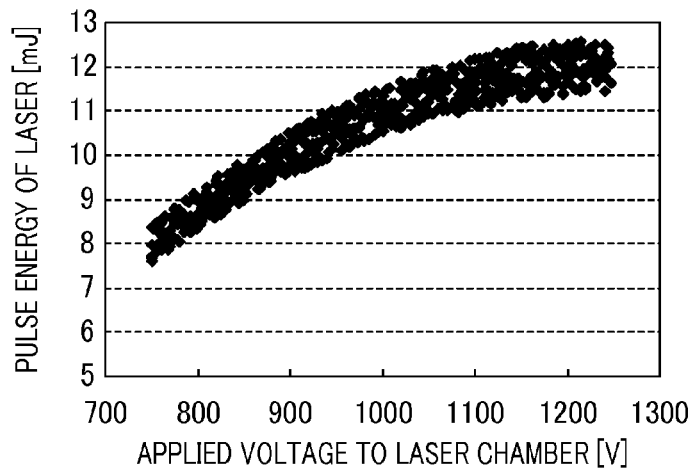
Figure 8C:
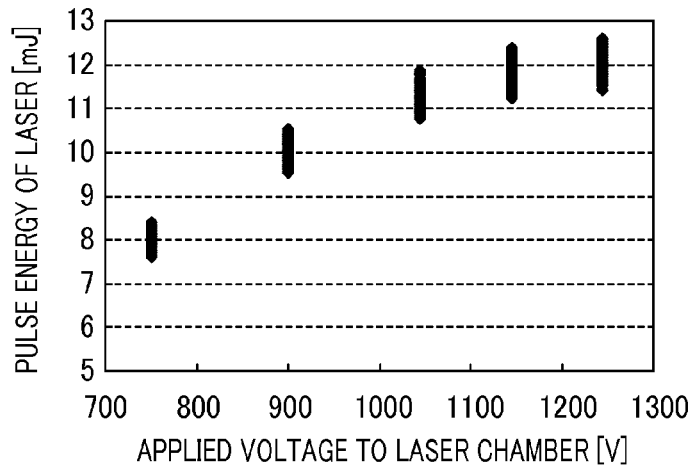

FIGS. 8A to 8C are graphs illustrating the pulse energy of the laser with respect to the applied voltage to the laser chamber (E-V characteristic) shown in FIGS. 7A to 7C. Here, FIG. 8A shows the pulse energy with respect to the applied voltage in FIG. 7A, hereinafter, FIG. 8B and FIG. 8C respectively show the pulse energy with respect to the applied voltage in FIG. 7B and FIG. 7C. In the pulse energy range (energy control range of the laser) in the art shown in FIG. 8A, plots converge at one area and the range is small. In contrast, in the pulse energy range shown in FIG. 8B as the first example of the present embodiment, the plots are distributed over wide area and the range is large. Further, in the pulse energy range shown in FIG. 8C as the second example of the present embodiment, each area size where plots converge is limited, but a plurality of areas is further distributed, thereby the plots are distributed over wide area as a whole.

Figure 10:
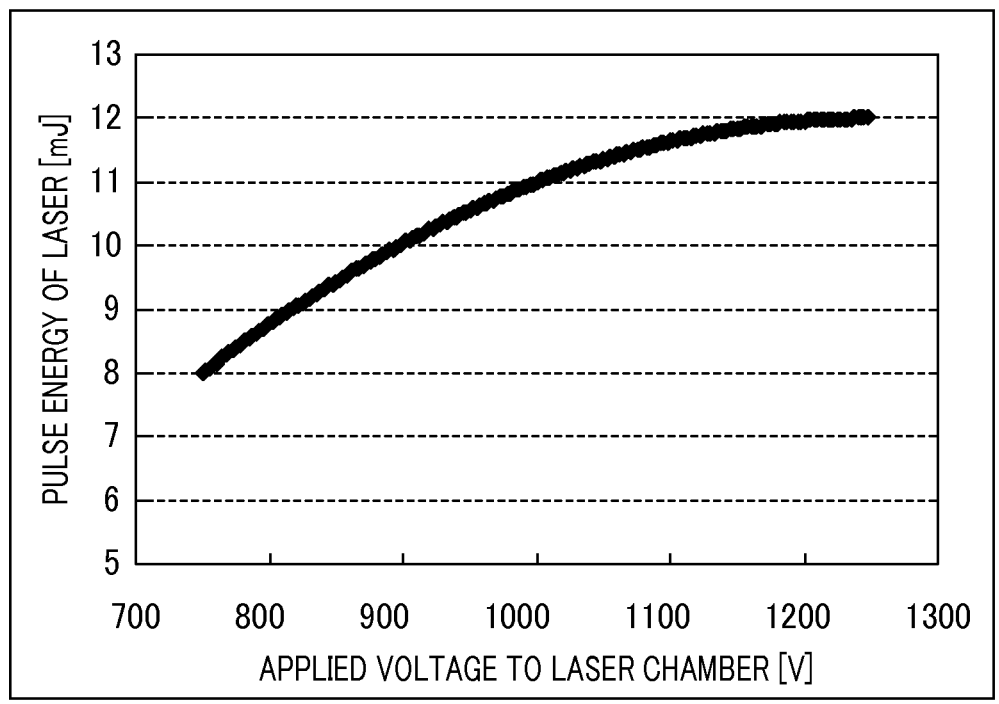
FIG. 10 is a graph illustrating an E-V characteristic in a conventional exposure apparatus.

The E-V characteristic of the excimer laser to be required in fact is shown in the graph of FIG. 10 described above. As known in the range shown in FIG. 8A, in order to correctly determine the E-V characteristic for wide range, enormous sample data is required and the calculation load is considerably large in the conventional apparatus. In contrast, in the present embodiment, as known in the ranges shown in FIG. 8B and FIG. 8C, the E-V characteristic is represented in the wide range in advance, therefore it allows easily determining the E-V characteristic with a smaller amount of calculation, and more accurately. Thus, the exposure apparatus 100 enables determining the E-V characteristic with high precision, by emitting the hundreds of laser pulses and by optionally changing the applied voltage.

Moreover, the exposure apparatus 100 performs the measurement for determining the E-V characteristic when the stage alignment is periodically performed. Since it is not necessary to stop the normal exposure operation during the measurement for determining the E-V characteristic, the exposure apparatus 100 is allowed to suppress the decrease of throughput and to accurately monitor the E-V characteristic which can change with time.

As described above, according to the present embodiment, it is possible to provide the exposure apparatus which is advantageous in terms of dose control precision and throughput.

Second Embodiment

Next, the exposure apparatus according to the second embodiment of the present invention will be explained. In the first embodiment described above, the case is exemplified of the measurement for determining the E-V characteristic performed at the timing of the stage alignment. In contrast, the exposure apparatus according to the present embodiment performs the measurement for determining the E-V characteristic when the transmittance in the optical path of the optical system from the light emission opening of the light source to the surface of the wafer (wafer surface) is measured. Hereinafter, it is noted that same reference numeral is provided to each element of the exposure apparatus according to the present embodiment corresponding to each element of the exposure apparatus 100 according to the first embodiment in order to simplify the description. The exposure apparatus 100 controls the exposure amount to the wafer surface, based on the output from the first photoelectric conversion unit 6. Therefore, it is desirable to clarify the relation between the illuminance on the wafer surface and the first photoelectric conversion unit 6, in order to correctly control the exposure amount. Then, the exposure apparatus 100 periodically measures the transmittance in the light path and determines the relation.

FIG. 9 is a flowchart illustrating the operation sequence of the transmittance measurement in the light path in the present embodiment. Firstly, the controller 102 commands the illumination system 101 to drive the ND filter and each optical element for matching the illumination mode and optical condition during exposure to the position necessary for the transmittance measurement, as the adjustment of the illumination mode (step S201). Here, for example, the illuminance on the wafer surface is largely changed according to the condition of each optical element (for example, the ND filter or the like) of the illumination system 101, so that the measurement condition for the transmittance measurement is set the same every time. Next, the controller 102 moves the wafer stage 17 so as to locate the second photoelectric conversion unit 19 in the area where the exposure light is irradiated in order to measure the illuminance on the wafer surface (step S202). In a case where the reticle 13 is held by the reticle stage 14, the controller 102 carries out control so as to take the reticle 13 from the reticle stage 14. However, even in a manner of holding the reticle 13, for example, in the case where an opening for measuring the illuminance on the wafer surface is configured in the reticle stage 14 in advance, the controller 102 may move the reticle stage 14 so that the light from the light source 1 passes through the opening. It is presumed that illuminance on the wafer surface is measured by using the second photoelectric conversion unit 19 in the exposure apparatus 100, but it may be possible to measure the illuminance by using an exterior measuring instrument (sensor) that is carried in from the outside of the exposure apparatus 100. Next, the controller 102 performs laser emission from the light source 1 and performs simultaneous detection of the laser at the first photoelectric conversion unit 6 and the second photoelectric conversion unit 19 (step S203). Since the excimer laser has energy variation about plus or minus 10 percent per pulse as explained above, a laser of about several hundred to several thousand pulses is emitted in the transmittance measurement, and the average process is performed on the detected value thereof, then the influence caused by the variation is suppressed. In the laser emission, in a manner similar to the first embodiment, as shown in FIG. 7B or FIG. 7C, the applied voltage to the laser chamber is changed per pulse. Next, the controller 102 determines correction coefficient (output ratio) $\alpha$ ($\alpha$=P0/P1) from the detected value P0 of the first photoelectric conversion unit 6 and from the detected value P1 of the second photoelectric conversion unit 19 (step S204). The detected values P0 and P1 and the correction coefficient $\alpha$ are stored in a storage (not illustrated) in the exposure apparatus 100, and they are referred as transmittance correction processes, when each exposure condition such as laser oscillating condition upon exposure and driving profile of the wafer stage 17 is determined. Then, the controller 102 determines the E-V characteristic of the laser by using the result measured in step S203, in a similar manner to step S107 in FIG. 5 in the first embodiment (step S205).

Accordingly, in the present embodiment, the measurement for determining the E-V characteristic is performed when a transmittance measurement is periodically performed, and also in this case, it is not necessary to stop a normal exposure operation during the measurement for determining the E-V characteristic. That is, the present embodiment has same effect as the first embodiment.

In the above embodiments, the measurement for determining the E-V characteristic is performed when the stage alignment or the transmittance measurement is performed. However, the present invention is not limited to them, and the measurement for determining the E-V characteristic may be performed in the whole of the calibration process in which the pulse light emitted from the light source 1 for exposure is the measurement light. For example, the exposure apparatus 100 enables performing the process of cleaning impurities that have adhered to a glass material in the apparatus with an exposure light, and the present invention is applicable to the cleaning process.

(Device Manufacturing Method)

Next, a description will be given of a method for manufacturing a device (semiconductor device, liquid crystal display device, or the like) according to one embodiment of the present invention. The semiconductor device is manufactured by a front-end process in which an integrated circuit is formed on a wafer and a back-end process in which an integrated circuit chip is completed as a product from the integrated circuit on the wafer formed in the front-end process. The front-end process includes a step of exposing a wafer coated with a photosensitizer using the above-described exposure apparatus and a step of developing the exposed wafer. The back-end process includes an assembly step (dicing and bonding) and a packaging step (sealing). The liquid crystal display device is manufactured by a process in which a transparent electrode is formed. The process of forming a transparent electrode includes a step of applying a photosensitizer to a glass substrate on which a transparent conductive film is deposited, a step of exposing the glass substrate coated with the photosensitizer using the above-described exposure apparatus, and a step of developing the exposed glass substrate. According to the device manufacturing method of the present embodiment, a device having a higher quality than that of the conventional device may be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-228979 filed Nov. 5, 2013, which is hereby incorporated by reference herein in its entirety.

What is claimed is:

1. An exposure apparatus that includes a light source for emitting pulse light and exposes a substrate to the pulse light via an original, the apparatus comprising:
a detector configured to detect a light quantity of the pulse light; and
a controller configured to control the light source and the detector,
wherein the controller is configured to execute a first calibration process for obtaining a relation between a control input to the light source and a light quantity of a pulse light from the light source, based on light quantities of a plurality of pulse lights detected by the detector by causing the light source to emit the plurality of the pulse lights with a plurality of the control input, in parallel with execution of a second calibration process which is different from the first calibration process and executed using the plurality of pulse lights.

2. The apparatus according to claim 1, wherein the controller is configured to generate the control input based on the relation.

3. The apparatus according to claim 1, further comprising:
a projection optical system configured to project light from the original onto the substrate; and
a substrate holder configured to hold the substrate and to be movable,
wherein the second calibration process includes a process for obtaining a reference position of the substrate holder by projecting a pulse light from the light source by the projection optical system.

4. The apparatus according to claim 3, further comprising:
an original holder including a mark, and configured to hold the original and to be movable,
wherein the second calibration process includes a process for obtaining the reference position by projecting a pulse light from the light source, via the mark and the projection optical system, to a mark included in the substrate holder.

5. The apparatus according to claim 1, further comprising:
an optical system configured to guide pulse light from the light source to the substrate,
wherein the second calibration process includes a process for obtaining a transmittance of at least a part of an optical path of the optical system using a pulse light from the light source.

6. The apparatus according to claim 1, wherein the control input corresponds to a voltage applied to the light source.

7. The apparatus according to claim 1, wherein the light source is an excimer laser light source.

8. An exposure method of performing exposure of a substrate to pulse light emitted from a light source via an original, the method comprising steps of:
executing a first calibration process for obtaining a relation between a control input to the light source and a light quantity of a pulse light from the light source based on light quantities of a plurality of pulse lights detected by causing the light source to emit the plurality of pulse lights from the light source with a plurality of the control input, in parallel with execution of a second calibration process which is different from the first calibration process and executed using the plurality of pulse lights, and
generating the control input based on the obtained relation to perform the exposure.

9. A method of manufacturing a device, the method comprising steps of:
exposing a substrate to light using an exposure apparatus; and
developing the exposed substrate; and
processing the developed substrate to manufacture the device,
wherein the exposure apparatus includes a light source for emitting pulse light and exposes the substrate to the pulse light via an original, and includes:
a detector configured to detect a light quantity of the pulse light; and
a controller configured to control the light source and the detector,
wherein the controller is configured to execute a first calibration process for obtaining a relation between a control input to the light source and a light quantity of a pulse light from the light source, based on light quantities of a plurality of pulse lights detected by the detector by causing the light source to emit the plurality of the pulse lights with a plurality of the control input, in parallel with execution of a second calibration process which is different from the first calibration process and executed using the plurality of pulse lights.

\* \* \* \* \*